United States Patent [19]

Yamamoto et al.

[11] 4,363,088

[45] Dec. 7, 1982

[54] ELECTRIC POWER SOURCE UNITS

[75] Inventors: Hirotaka Yamamoto, Tokyo; Minoru Obara, Kawasaki; Shinobu Fujiwara, Nikaho, all of Japan

[73] Assignee: TDK Electronics Co., Ltd., Tokyo, Japan

[21] Appl. No.: 223,261

[22] Filed: Jan. 8, 1981

[30] Foreign Application Priority Data

Jan. 11, 1980 [JP] Japan .................................... 55-1319

[51] Int. Cl.$^3$ ............................................. H02M 3/18
[52] U.S. Cl. ..................................................... 363/59
[58] Field of Search ...................... 361/321; 363/59–61

[56] References Cited

U.S. PATENT DOCUMENTS

| | | | |
|---|---|---|---|
| 3,676,351 | 7/1972 | Taki et al. ........................ | 361/321 X |
| 3,745,431 | 7/1973 | Imamura et al. ..................... | 361/321 |
| 4,226,735 | 10/1980 | Sakabe ............................ | 361/321 X |

FOREIGN PATENT DOCUMENTS

2501838  7/1976  Fed. Rep. of Germany ........ 363/61

*Primary Examiner*—William M. Shoop
*Attorney, Agent, or Firm*—Wyatt, Gerber, Shoup, Scobey & Badie

[57] ABSTRACT

The invention provides a novel electric power source unit such as a high-speed pulse power source unit built with a pulse-forming circuit and a DC electric power source unit built with a high-frequency voltage-multipler rectifying circuit having high performance in comparison with conventional units. The inventive unit comprises, as a part of the circuit, at least one ceramic capacitor composed of a ceramic dielectric body made of a strontium titanate-based composition unlike the conventional ones in the prior art comprising barium titanate-based ceramic capacitors. Four classes of the preferred compositions are disclosed each containing strontium titanate as the principal component.

4 Claims, 10 Drawing Figures

ELECTRIC POWER SOURCE UNITS

BACKGROUND OF THE INVENTION

The present invention relates to an electric power source unit or, more particularly, to an electric power source unit having improved power output performance with a high-speed pulse-forming circuit or a high-frequency voltage-multipler rectifying circuit built with a ceramic capacitor.

As is known in the art, high-speed pulse-forming circuits are used in the electric power source units suitable for laser excitation, radar-pulse forming, X-ray flash generation, xenon flash excitation and the like including Marx circuits, capacitor bank circuits, L-C inversion circuits and PFN circuits. On the other hand, voltage-multiplier rectifying circuits are used in the power source units for television sets, oscilloscopes, X-ray units, electron microscopes, radars, lasers, high voltage lamps, electrostatic copying machines, electrostatic coating machines, electric dust collectors and the like. All of these circuits are composed with polymer film and paper capacitors which may be of the oil-impregnation type, or ceramic capacitors.

Among various types of the capacitors, ceramic capacitors are the most promising ones and rapidly replacing the oil-impregnation type polymer film and paper capacitors widely in conventional uses by virtue of the advantages of the easiness in manufacturing and handling, higher mechanical strengths and larger thermal and chemical stability as well as the possibility of miniaturization.

Most of the ceramic capacitors currently on use are formed of a ceramic of which the ingredient is based on barium titanate. When a barium titanate-based ceramic capacitor is used in the above mentioned high-speed pulse-forming circuits or voltage-multiplier rectifying circuits, the proportionality of the power output relative to the applied voltage is satisfactory within a limit of a relatively low applied voltage. In a region of relatively high applied voltages, on the contrary, the proportionality of the power output and the applied voltage is lost and an increase in the applied voltage does not lead to an increase of the power output in proportion. Further increase of the applied voltage over a certain limit necessarily results in leveling off of the power output. In particular, the limiting voltage beyond which the power output levels off is lowered when the ambient temperature is high so that difficulties are encountered in obtaining high power outputs with the circuits.

In recent years, there has been a growing demand to increase the voltage of the power output in the above mentioned types of the electric power source units and it is sometimes desired to apply a voltage to the capacitors as high as the capacitor can withstand. As a consequence, an improvement of the above described drawbacks has become one of the most important problems in the field of the art.

It has been a generally accepted understanding that the above described drawbacks are mostly due to the design of the circuit per se or certain defects in the apparatus design so that efforts have been concentrated in these points but without noticeable success.

SUMMARY OF THE INVENTION

The present invention is a result of the extensive investigations undertaken by the inventors leading to a conclusion that the above described difficulties in the conventional electric power source units are caused rather by the use of capacitors made of a ferroelectric ceramic material and to a discovery that the problems are resolved when capacitors made of a paraelectric or a relatively weak ferroelectric ceramic material are used in the circuit.

That is, the object of the present invention is to provide a high performance electric power source unit free from the above described problems in the prior art and the inventive power source unit comprises at least one capacitor made of a strontium titanate-based ceramic.

The inventive power source unit can satisfy the proportionality between the applied voltage and the power output in a much wider range of the applied voltage than in the conventional units. In addition, the dielectric loss factor can be greatly reduced in the strontium titanate-based ceramic capacitors in comparison with conventional barium titanate ceramic capacitors so that the high frequency performance of the power source unit can be improved to a large extent and the serviceable life of the unit is largely extended owing to the decreased failure of the capacitors.

DETAILED DESCRIPTION OF THE PREFERRED EMBODIMENTS

As a general comparison between barium titanate-based and strontium titanate-based ceramics, a sufficiently large dielectric constant is readily obtained with the former type of ceramics though with a relatively large dielectric loss whereas the strontium titanate-based ceramics have rather smaller dielectric constant than the barium titanate-based ceramics but a much smaller dielectric lass factor of 0.5% or smaller or, in particular, 0.06% or smaller than in the barium titanate-based ones is readily obtained with the strontium titanate-based ceramics depending on the composition.

The key factor for the improvement of the high frequency performance and extended durability of a ceramic capacitor is the small dielectric loss whereas the requirement for the dielectric constant has been found to be so high that a value of 1000 or larger is sufficient in strontium titanate-based ceramic capacitors for the dielectric constant in most applications. Since strontium titanate-based ceramics having a dielectric constant of at least 1500 or at least 1800 are readily available in the present status of the art, the dielectric constant is no longer the critical parameter limiting the performance and durability of the ceramic capacitor or the electric power source units built by use of the ceramic capacitors.

The present invention is characteristic in the high-performance electric power source unit with a high-speed pulse-forming circuit or a high-frequency rectifying circuit in which the dielectric loss is minimized by the use of capacitors made of a strontium titanate-based ceramic. As a benefit accompanying the reduced dielectric loss, the temperature rising of the ceramic capacitor during application of a voltage is decreased so that the serviceable life of the capacitor is extended with retardation of the aging phenomenon of the capacitor.

On the other hand, the impedance of a circuit is inversely proportional to the product of the frequency and the capacitance so that the impedance can be decreased at a higher frequency and the capacitance can be reduced at a higher frequency. The strontium titanate-based ceramic capacitors are advantageous also in this respect. On the contrary, conventional barium titanate-based ceramic capacitors exhibit particularly large dielectric loss at a frequency higher than 1 MHz resulting in large temperature rising with considerable disadvantages in comparison with the strontium titanate-based ceramic capacitors.

Further, the oil-impregnation type polymer film and paper capacitors are satisfactorily usable at low frequencies owing to their large capacitance but quite unsuitable for high frequency uses due to the large inductance.

When the proportionality between the applied voltage and the power output of the source unit is desired to be maintained over a range as wide as possible, it is a requirement that the voltage dependency and the temperature characteristic of the capacitance should be minimized. Strontium titanate-based ceramic capacitors are advantageous also in this respect since the voltage dependency of them can be as small as 10% or smaller per 1 kV/mm thickness of the dielectric material and the temperature characteristic of the capacitance can be such that the decrease of the capacitance at 85° C. from the value at 20° C. is 40% or smaller.

Accordingly, the electric power source unit of the present invention with the highest performance is manufactured by use of the capacitors of strontium titanate-based ceramics having a dielectric constant of at least 1000, dielectric loss factor of 0.5% or smaller, voltage dependency of the capacitance of 10% or smaller at 1 kV/mm thickness of the dielectric material and decrease of the capacitance at 85° C. is 40% smaller from the value at 20° C.

Strontium titanate-based ceramic materials satisfying the above requirements can be prepared with the formulations, for example, given below in four classes (1) to (4).

(1) A ceramic composed of 20 to 51% by weight of strontium titanate, 5 to 30% by weight of a bismuth titanate having a molar ratio of $Bi_2O_3:TiO_2$ of 2:3 to 1:5, and 15 to 70% by weight of barium titanate with addition of a small amount of at least one additive ingredient selected from the group consisting of oxides of manganese, niobium, chromium, nickel, cobalt and iron, clay materials and oxides of rare earth elements.

(2) A ceramic composed of 60 to 75% by weight of strontium titanate, 5 to 25% by weight of bismuth oxide, 5 to 30% by weight of a titanium oxide and up to 5% by weight of magnesium oxide with addition of a small amount of at least one additive ingredient selected from the group consisting of oxides of manganese, niobium, chromium, nickel, cobalt and iron, clay materials and oxides of rare earth elements.

(3) A ceramic composed of 40 to 80% by weight of strontium titanate, 15 to 40% by weight of a bismuth titanate having a molar ratio of $Bi_2O_3:TiO_2$ of 2:3 to 1:5, and 3 to 20% by weight of lead titanate with addition of a small amount of at least one additive ingredient selected from the group consisting of oxides of manganese, niobium, chromium, nickel, cobalt and iron, clay materials and oxides of rare earth elements.

(4) A ceramic composed of 30 to 60% by weight of strontium titanate, 0.5 to 30% by weight of calcium titanate, 5 to 35% by weight of lead titanate and 5 to 30% by weight of a bismuth titanate having a molar ratio of $Bi_2O_3:TiO_2$ of 2:3 to 1:5 with addition of a small amount of at least one additive ingredient selected from the group consisting of oxides of manganese, niobium, chromium, nickel, cobalt and iron, clay materials and oxides of rare earth elements.

In each of the above four classes of the ceramic formulations, the rare earth oxide is added in order to further decrease the dielectric loss. Suitable rare earth oxides, for example, are ceric oxide, lanthanum oxide and the like used usually in an amount of 0.01 to 10% by weight.

The oxides of manganese, niobium, chromium, nickel, cobalt and iron as well as the clay materials serve as a mineralizing agent to give a sintered body with further densified structure. The amount of their addition is usually in the range from 0.1 to 0.5% by weight.

Among the above given four classes of the ceramic materials, those belonging to the first class are characterized by their relatively large dielectric constant for a strontium titanate-based ceramic. Those belonging to the second class of the ceramic materials are characterized by the small voltage dependency of the capacitance. Thus, it is a matter of option to select and use any one or more of the additive ingredients according to the particular object of the use of the ceramic capacitors.

Figure 1:
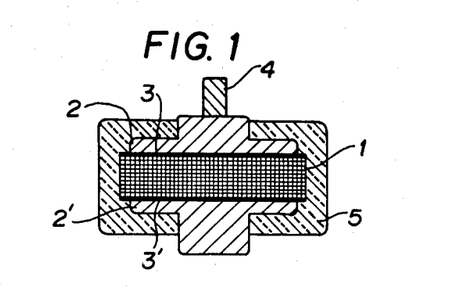
FIG. 1 is a schematic cross sectional view of a typical ceramic capacitor used in the inventive electric power source unit.

A typical example of the ceramic capacitors used in the inventive electric power source unit is illustrated by the cross section in FIG. 1. In this figure, the sintered ceramic body 1 is provided with electrodes 3,3' on the opposite surfaces, to which the terminals 2,2' are bonded by soldering or other suitable means. The body of the capacitor is as a whole encapsulated in a synthetic resin 5 such as an epoxy resin with the end surfaces of the terminals 2,2' being exposed and a connector 4 being bonded thereto.

Figure 2:
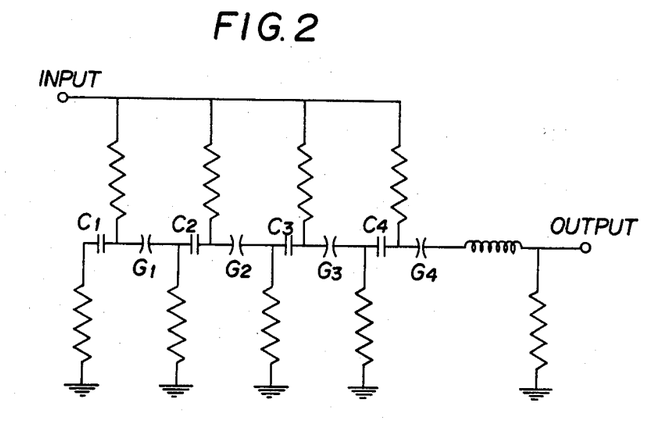
FIGS. 2 to 5 are each a diagram of a Marx circuit, capacitor bank circuit, L-C inversion circuit and PFN circuit, respectively, used for the high-speed pulse-forming circuit in the inventive electric power source unit.
Figure 3:
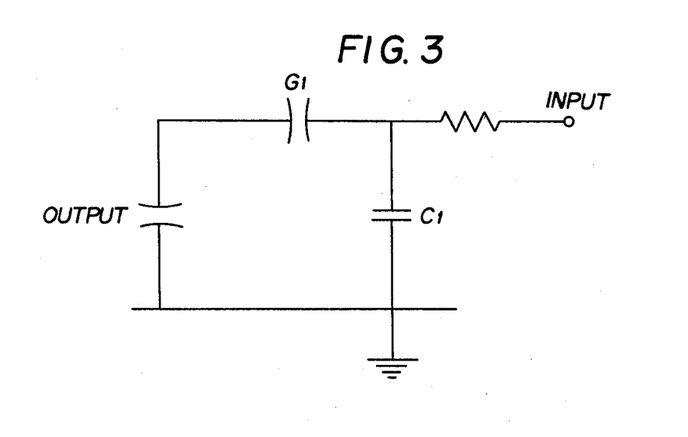
Figure 4:
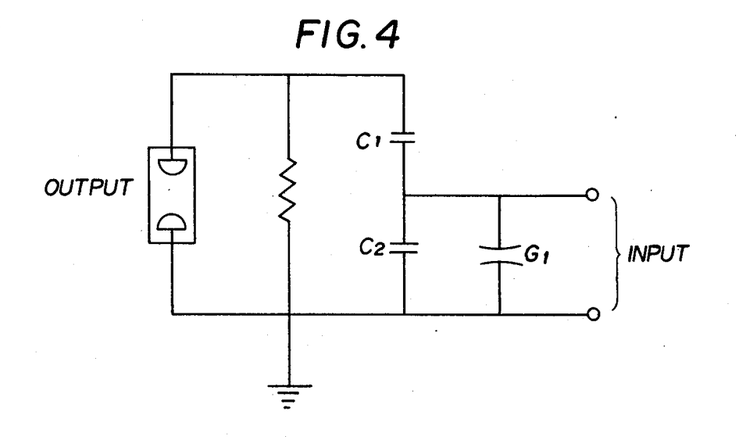
Figure 5:
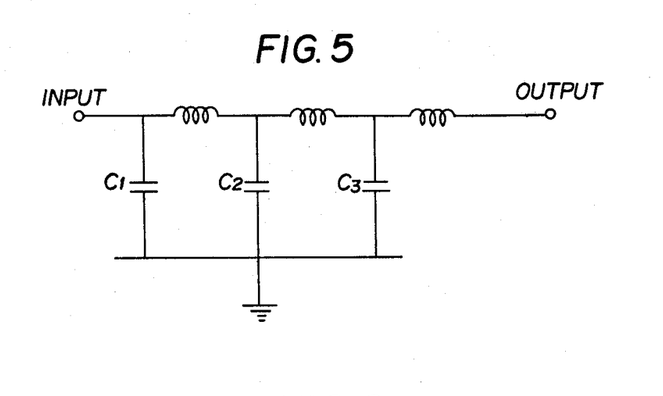
Figure 6:
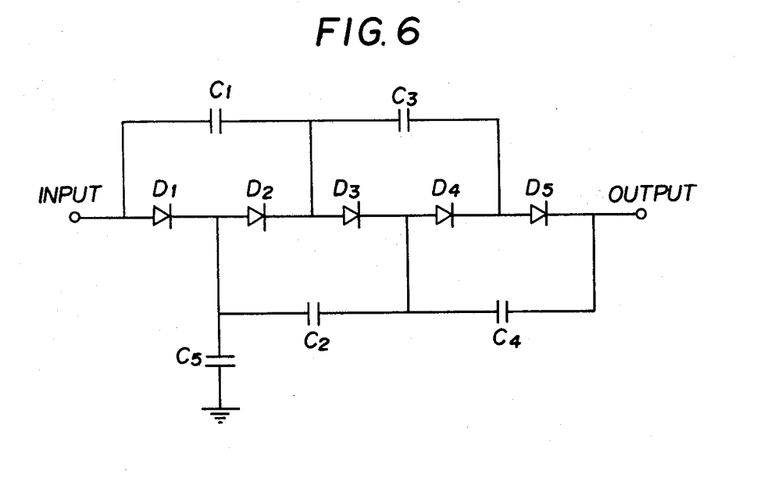
FIG. 6 is a diagram of a high-frequency voltage-multipler rectifying circuit used in the inventive electric power source unit.

The inventive electric power source unit is assembled and constructed with the above described ceramic capacitor or capacitors as a component or components of a high-speed pulse-forming circuits or a high-frequency voltage-multipler rectifying circuit. The pulse-forming circuit may be a Marx circuit as illustrated in FIG. 2, a capacitor bank circuit as illustrated in FIG. 3, a L-C inversion circuit as illustrated in FIG. 4 or a PFN circuit as illustrated in FIG. 5. Further, an example of the circuit diagram of the high-frequency voltage-rectifying circuit is illustrated in FIG. 6. In these figures, $C_1$ to $C_5$ each denote a ceramic capacitor, $G_1$ to $G_4$ each denote a spark gap and $D_1$ to $D_5$ each denote a diode.

Figure 7:
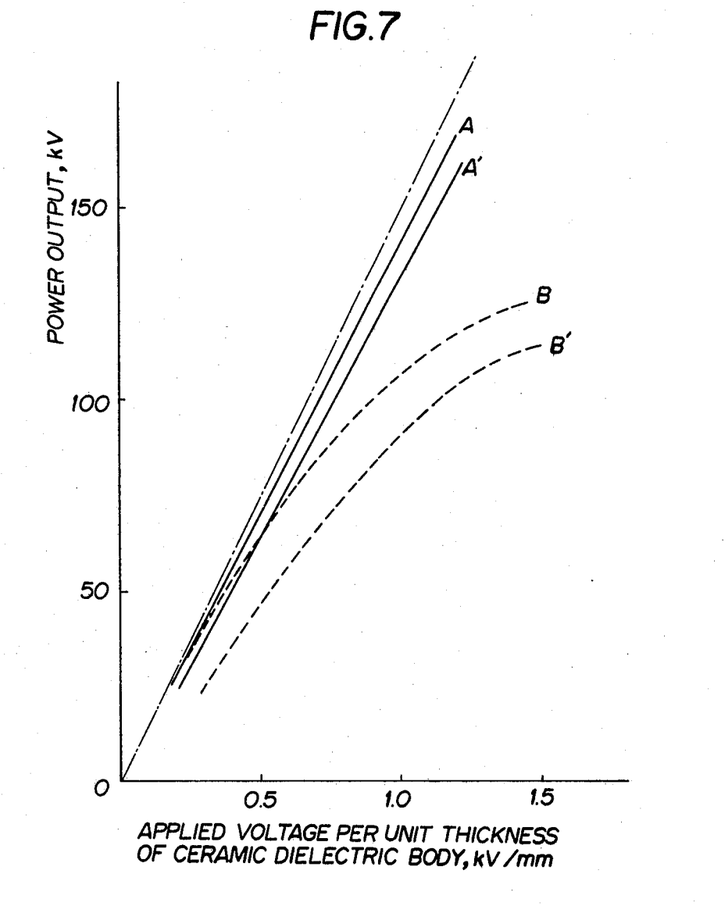
FIGS. 7 to 10 are each a graphic showing of the performance of ceramic capacitors making a comparison between strontium titanate-based ceramic capacitors (curves A and A') and barium titanate-based ceramic capacitors (curves B and B').

In the next place, the unique characteristics of the strontium titanate-based ceramic capacitors used in the inventive electric power source unit are well illustrated in comparison with conventional barium titanate-based ceramic capacitors with reference to FIG. 7 in which curves A and A' are for an inventive strontium titanate-based ceramic capacitor and curves B and B' are for a conventional barium titantate-based ceramic capacitor. The figure is a graphic showing of the relationship between the applied voltage per unit thickness of the ceramic body in kV/mm and the output of the power source in kV. The chain line indicates the ideal proportionality between the parameters. Curves A and B are for the ambient temperature of 20° C. and curves A' and B' are for 85° C. As is clear from the figure, the curves for the conventional ceramic capacitor level off irrespective of the ambient temperature as the applied voltage increases and the leveling-off temperature is lower at 85° C. than at 20° C. On the contrary, the strontium titanate-based ceramic capacitors used in the inventive power source unit are free from the phenomenon of leveling off and exhibit almost satisfactory proportionality at both 20° C. and 85° C.

By further increasing the voltage applied to the capacitors, the strontium titanate-based ceramic capacitor exhibited a much higher, say about 1.5 times higher, break-down voltage than the conventional barium titanate-based ceramic capacitor. In this regard, the inventive power source unit is advantageous in the wide versatility in its use.

Figure 8:
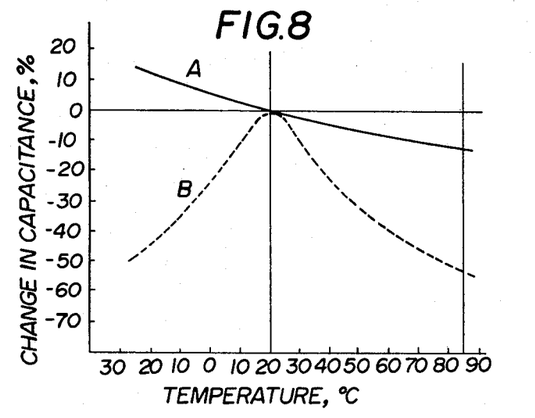

Further, FIG. 8 illustrates the temperature characteristic of the capacitance of the strontium titanate-based ceramic capacitor (curve A) and the barium titanate-based ceramic capacitor (curve B) by plotting the relative changes in the values at varied temperatures taking the values at 20° C. as the base. As is clear from the figure, the capacitance of the barium titanate-based one decreases about 55% at 85° C. while the decrease in the strontium titanate-based ceramic capacitor is only about 15% at 85° C.

Figure 9:
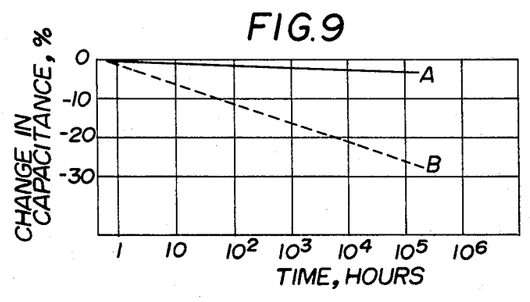

Further illustration of the characteristic difference between the strontium titanate- and barium titanate-based ceramic capacitors is given by FIG. 9 in which the relative changes in the capacitance with aging are plotted as a function of the lapsed time in a logarithmic scale. As is clear from this figure, the strontium titanate-based ceramic capacitor (curve A) exhibited only a few % of decrease in the capacitance even after $10^5$ hours when the barium titanate-based one exhibited a decrease of 25% or more.

Figure 10:
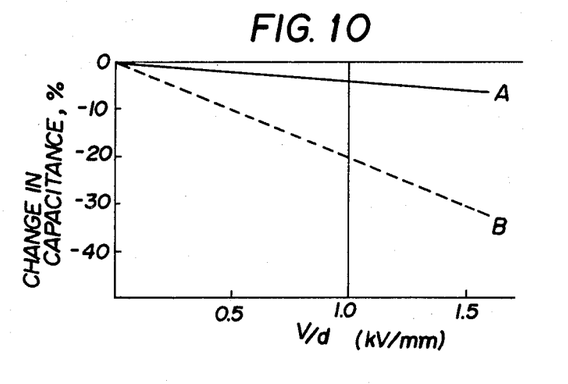

FIG. 10 is a graph showing the voltage dependency of the capacitance with the relative changes in the value of the capacitance in % taken as the ordinate plotted as a function of the applied voltage in kV divided by the thickness d in mm of the dielectric ceramic body. As is clear from this figure, the strontium titanate-based ceramic capacitor (curve A) has very small voltage dependency in comparison with the barium titanate-based ceramic capacitor (curve B), the decrease at $V/d=1$ being only a few % for the former and about 20% for the latter.

As is readily understood from the above given comparison of the characteristics of the capacitors, the electric power source unit of the invention constructed with a strontium titanate-based ceramic capacitor is capable of producing a higher power output as a power source than with a similar unit with the barium titanate-based ceramic capacitor, and the stability of the power output is greatly improved over a long period of continued use.

In summarizing, the electric power source unit of the present invention has advantages, by virtue of the use, as a component of the circuit, of one or more of the strontium titanate-based ceramic capacitors with much smaller, say, a half, of tolerance than in the conventional ceramic capacitors as a result of the use of stable materials and much higher working voltage and dielectric strength than in the conventional ceramic capacitors, that a well-controlled power output is obtained as calculated and designed, that the number of stages in a multi-stage circuit can be reduced permitting a more compact design of the power source unit and the stability of the power output is improved and that a power source unit of a large power output can readily be designed.

In the following, the present invention is further described in detail by way of examples. In the examples, the characterization of various parameters of the capacitors were undertaken as below.

(a) The values of the dielectric constant and tan δ are those obtained at 20° C. at a frequency of 1 MHz.

(b) The temperature characteristic is expressed in the relative decrease in % of the capacitance of the capacitor at 85° C. in comparison with the value at 20° C.

(c) The voltage dependency is expressed by the relative decrease in % of the capacitance at an electric field of 1 kV/mm of the thickness of the dielectric ceramic body.

EXAMPLE 1

Strontium titanate, a bismuth titanate, barium titanate in proportions indicated in Table 1 and other necessary additive ingredients were uniformly blended with admixture of a suitable amount of a binder and the mixture was shaped by compression molding into a disc of a 16.5 mm diameter and 1 mm thickness, which was sintered at about 1200° C. for 2 hours into a ceramic body. These sintered bodies were each provided with electrodes to be a ceramic capacitor of the form as illustrated in FIG. 1. The characteristics of these capacitors are shown in Table 1.

TABLE 1

|  |  | Sample No. | | |
| --- | --- | --- | --- | --- |
|  |  | 1 | 2 | 3 |
| Composition, % by weight | $SrTiO_3$ | 50.9 | 36.4 | 29.1 |
|  | $2Bi_2O_3.3TiO_2$ | 19.1 |  |  |
|  | $Bi_2O_3.3TiO_2$ |  | 13.6 | 10.9 |
|  | $BaTiO_3$ | 30 | 50 | 60 |
| Properties | Dielectric constant | 1200 | 1780 | 2580 |
|  | Temperature characteristic, % | −20.5 | −30 | −36 |
|  | tan δ, % | 0.4 | 0.1 | 0.1 |
|  | Voltage dependency, % | −2 | −2.5 | −4.8 |

As is shown in the table, all of the ceramic capacitors prepared in this example had a dielectric constant of at least 1200, temperature characteristic of the capacitance of 36% or smaller, dielectric loss of 0.4% or smaller and voltage dependency of the capacitance at an electric field of 1 kV/mm thickness of the dielectric ceramic body of 5% or smaller.

The ceramic capacitors prepared in the same formulation as in Sample No. 2 above were used for building an electric power source unit having a Marx circuit as shown in FIG. 2. The relationship between the voltage applied to each of the capacitors and the output of the power source unit is plotted in FIG. 7 to give the curves A and A' for the ambient temperatures of 20° C. and 85° C., respectively.

EXAMPLE 2

Three kinds of ceramic capacitors were prepared in the same manner as in Example 1 each with the formulation composed of strontium titanate, bismuth oxide, titanium oxide and magnesium oxide in the proportion as indicated in Table 2 below as well as other necessary additive ingredients. The characteristics of these ceramic capacitors are also given in Table 2.

TABLE 2

|  |  | Sample No. | | |
| --- | --- | --- | --- | --- |
|  |  | 4 | 5 | 6 |
| Composition, % by weight | $SrTiO_3$ | 72.3 | 63.3 | 62.4 |
|  | $Bi_2O_3$ | 7.1 | 11.9 | 11.7 |
|  | $TiO_2$ | 20.6 | 23.9 | 23.5 |
|  | MgO | 0 | 0.9 | 2.4 |
| Properties | Dielectric constant | 1050 | 1310 | 1215 |
|  | Temperature characteristic, % | −19 | −12.3 | −8.5 |
|  | tan δ, % | 0.3 | 0.1 | 0.1 |
|  | Voltage dependency, % | −0.9 | −0.8 | −1.0 |

As is shown in the table, all of the ceramic capacitors prepared in this example had a dielectric constant of at least 1000, temperature characteristics of the capacitance of 20% or smaller, dielectric loss of 0.3% or smaller and voltage dependency of the capacitance of 1.0% or smaller.

EXAMPLE 3

Three kinds of ceramic capacitors were prepared in the same manner as in Example 1 each with the formulation composed of strontium titanate, either one of 2 kinds of bismuth titanates and lead titanate in the proportion as indicated in Table 3 below as well as other necessary additive ingredients. The characteristics of these ceramic capacitors are also given in Table 3.

TABLE 3

|  |  | Sample No. | | |
| --- | --- | --- | --- | --- |
|  |  | 7 | 8 | 9 |
| Composition, % by weight | $SrTiO_3$ | 69.4 | 65.9 | 61.6 |
|  | $Bi_2O_3.2TiO_2$ |  | 20.0 |  |
|  | $Bi_2O_3.3TiO_2$ | 25.9 |  | 23.2 |
|  | $PbTiO_3$ | 4.7 | 14.1 | 15.2 |
| Properties | Dielectric constant | 1060 | 1380 | 1880 |
|  | Temperature characteristic, % | −15 | −26.2 | −20.5 |
|  | tan δ, % | 0.06 | 0.5 | 0.1 |
|  | Voltage dependency, % | −0.8 | −9.0 | −5.4 |

As is shown in the table, all of the ceramic capacitors prepared in this example had a dielectric constant of at least 1000, temperature characteristic of the capacitance of 27% or smaller, dielectric loss of 0.5% or smaller and voltage dependency of the capacitance at an electric field of 1 kV/mm thickness of the dielectric ceramic body of 10% or smaller.

EXAMPLE 4

Three kinds of ceramic capacitors were prepared in the same manner as in Example 1 each with the formulation composed of strontium titanate, either one of 2 kinds of bismuth titanates, calcium titanate and lead titanate in the proportion as indicated in Table 4 below as well as other necessary additive ingredients. The characteristics of these ceramic capacitors are also given in Table 4.

TABLE 4

|  |  | Sample No. | | |
| --- | --- | --- | --- | --- |
|  |  | 10 | 11 | 12 |
| Composition, % by weight | $SrTiO_3$ | 31.0 | 40.4 | 36.4 |
|  | $Bi_2O_3.2TiO_2$ |  | 26 |  |
|  | $Bi_2O_3.3TiO_2$ | 28.6 |  | 30 |
|  | $CaTiO_3$ | 15.9 | 13.6 | 18.6 |
|  | $PbTiO_3$ | 24.5 | 20 | 15 |
| Properties | Dielectric constant | 1250 | 1800 | 1170 |
|  | Temperature characteristic, % | −2.0 | +20.0 | −10.0 |
|  | tan δ, % | 0.1 | 0.2 | 0.1 |
|  | Voltage dependency, % | −1.8 | −4.4 | −0.8 |

As is shown in the table, all of the ceramic capacitors prepared in this example had a dielectric constant of at least 1100, temperature characteristic of the capacitance of 20% or smaller, dielectric loss of 0.2% or smaller and voltage dependency of the capacitance at an electric field of 1 kV/mm thickness of the dielectric ceramic body of 5% or smaller.

What is claimed is:

1. An electric power source unit having a high-speed pulse-forming circuit or a high-frequency voltage-multiplier rectifying circuit comprising at least two ceramic capacitors having a strontium titanate-based ceramic as the dielectric body.

2. The electric power source unit as claimed in claim 1 wherein the strontium titanate-based ceramic is a sintered composition selected from the group consisting of (a) compositions which comprise from 20 to 55% by weight of strontium titanate, from 5 to 30% by weight of a bismuth titanate, and from 15 to 70% by weight of barium titanate with admixture of at least one additive ingredient selected from the group consisting of oxides of manganese, niobium, chromium, nickel, cobalt and iron, clay materials and oxides of rare earth elements, (b) compositions which comprise from 60 to 75% by weight of strontium titanate, from 5 to 25% by weight of bismuth oxide, from 5 to 30% by weight of titanium oxide and magnesium oxide in an amount not to exceed 5% by weight with admixture of at least one additive ingredient selected from the group consisting of oxides of manganese, niobium, chromium, nickel, cobalt and iron, clay materials and oxides of rare earth elements, (c) compositions which comprise from 40 to 80% by weight of strontium titanate, from 15 to 40% by weight of a bismuth titanate and from 3 to 20% by weight of lead titanate with admixture of at least one additive ingredient selected from the group consisting of oxides of manganese, niobium, chromium, nickel, cobalt and iron, clay materials and oxides of rare earth elements, and (d) compositions which comprise from 30 to 60% by weight of strontium titanate, from 0.5 to 30% by weight of calcium titanate, from 5 to 35% by weight of lead titanate and from 5 to 30% by weight of a bismuth titanate with admixture of at least one additive ingredient selected from the group consisting of oxides of manganese, niobium, chromium, nickel, cobalt and iron, clay materials and oxides of rare earth elements.

3. The electric power source unit as claimed in claim 1 wherein the ceramic capacitors have a dielectric constant of at least 1000, a dielectric loss of 0.5% or smaller, a voltage dependency of the capacitor of 10% or smaller as expressed by the decrease in the capacitance at an electric field of 1 kV/mm of the thickness of the ceramic dielectric body and a temperature characteristic of the capacitance of 40% or smaller as expressed by the decrease in the capacitance at 85° C. compared to the capacitance at 20° C.

4. The electric power source unit as claimed in claim 2 wherein the bismuth titanate in the compositions of the groups (a), (c) and (d) is composed of bismuth oxide $Bi_2O_3$ and titanium oxide $TiO_2$ in a molar ratio $Bi_2O_3$:$TiO_2$ in the range from 2:3 to 1:5.

* * * * *